US010354887B2

United States Patent
Fischer et al.

(10) Patent No.: US 10,354,887 B2
(45) Date of Patent: Jul. 16, 2019

(54) ATOMIC LAYER ETCHING OF METAL OXIDE

(71) Applicant: Lam Research Corporation, Fremont, CA (US)

(72) Inventors: Andreas Fischer, Castro Valley, CA (US); Nerissa Draeger, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/717,076

(22) Filed: Sep. 27, 2017

(65) Prior Publication Data

US 2019/0096690 A1    Mar. 28, 2019

(51) Int. Cl.
| | |
|---|---|
| H01L 21/311 | (2006.01) |
| H01L 21/02 | (2006.01) |
| H01L 21/67 | (2006.01) |
| H01J 37/32 | (2006.01) |

(52) U.S. Cl.
CPC .... H01L 21/31105 (2013.01); H01L 21/0234 (2013.01); H01L 21/02321 (2013.01); H01L 21/02359 (2013.01); H01L 21/67069 (2013.01); H01L 21/67103 (2013.01); *H01J 37/321* (2013.01); *H01J 2237/2001* (2013.01); *H01J 2237/3341* (2013.01); *H01L 21/02175* (2013.01); *H01L 21/02178* (2013.01); *H01L 21/02181* (2013.01); *H01L 21/02186* (2013.01)

(58) Field of Classification Search
CPC ......... H01L 21/0234; H01L 21/02172–02189; H01L 21/31105–31122
See application file for complete search history.

(56) References Cited

U.S. PATENT DOCUMENTS

| | | | |
|---|---|---|---|
| 8,058,179 B1 | 11/2011 | Draeger et al. | |
| 9,905,412 B2* | 2/2018 | Yan | B08B 5/00 |
| 10,121,699 B2* | 11/2018 | Wang | H01L 21/02274 |
| 2007/0010100 A1 | 1/2007 | Raghuram et al. | |
| 2013/0175005 A1 | 7/2013 | Gowdaru et al. | |
| 2016/0035581 A1 | 2/2016 | Posseme et al. | |
| 2016/0379989 A1 | 12/2016 | Sharangpani et al. | |
| 2017/0018439 A1 | 1/2017 | Wang et al. | |
| 2017/0256416 A1 | 9/2017 | Fischer et al. | |
| 2018/0342403 A1* | 11/2018 | Anthis | H01L 21/0228 |

OTHER PUBLICATIONS

International Search Report for International Application No. PCT/US2018/044439 dated Nov. 13, 2018.
Written Opinion for International Application No. PCT/US2018/044439 dated Nov. 13, 2018.

* cited by examiner

*Primary Examiner* — Daniel Luke
(74) *Attorney, Agent, or Firm* — Beyer Law Group LLP

(57) ABSTRACT

A method for etching a metal oxide layer on a semiconductor substrate, comprising providing a plurality of cycles, is provided. Each cycle comprises exposing the metal oxide layer to a reactive hydrogen-containing gas or plasma to transform a part of the metal oxide layer into a layer of metal hydride, stopping the exposing the metal oxide layer to the reactive hydrogen-containing gas or plasma, heating the layer of metal hydride to at least a sublimation temperature to sublime the layer of metal hydride, and cooling the metal oxide layer to a temperature below the sublimation temperature.

10 Claims, 5 Drawing Sheets

US 10,354,887 B2

ATOMIC LAYER ETCHING OF METAL OXIDE

BACKGROUND

The disclosure relates to a method of forming semiconductor devices on a semiconductor wafer. More specifically, the disclosure relates to etching metal oxide layers in forming semiconductor devices.

In forming semiconductor devices, semiconductor devices may be formed with processes that etch metal oxide layers. Etching of metal oxides may use a chemical etch, using a halogen plasma to etch the metal oxide layers.

SUMMARY

To achieve the foregoing and in accordance with the purpose of the present disclosure, a method for etching a metal oxide layer on a semiconductor substrate, comprising providing a plurality of cycles is provided. Each cycle comprises exposing the metal oxide layer to a reactive hydrogen-containing gas or plasma to transform at least a part of the metal oxide layer into a layer of metal hydride, stopping the exposing the metal oxide layer to the reactive hydrogen-containing gas or plasma, heating the layer of metal hydride to at least a sublimation temperature to sublime the layer of metal hydride, and cooling the metal oxide layer to a temperature below the sublimation temperature.

In another manifestation, an apparatus for etching an etch layer of a metal oxide on a semiconductor substrate is provided. A reactive hydrogen-containing gas or plasma source provides a reactive hydrogen-containing gas or plasma to the etch layer. An etch layer heater is able to heat the etch layer. An etch layer cooler is able to cool the etch layer. A controller is controllably connected to the reactive hydrogen-containing gas or plasma source, the etch layer heater, and the etch layer cooler. The controller comprises at least one processor and computer readable media, comprising computer readable code for providing a plurality of cycles. Each cycle comprises exposing the etch layer to a reactive hydrogen-containing gas or plasma from the reactive hydrogen-containing gas or plasma source to transform at least a part of the etch layer into a layer of metal hydride, stopping the exposing the etch layer to the reactive hydrogen-containing gas or plasma, heating the layer of metal hydride to at least a sublimation temperature to sublime the layer of metal hydride, and cooling the etch layer to a temperature below the sublimation temperature.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
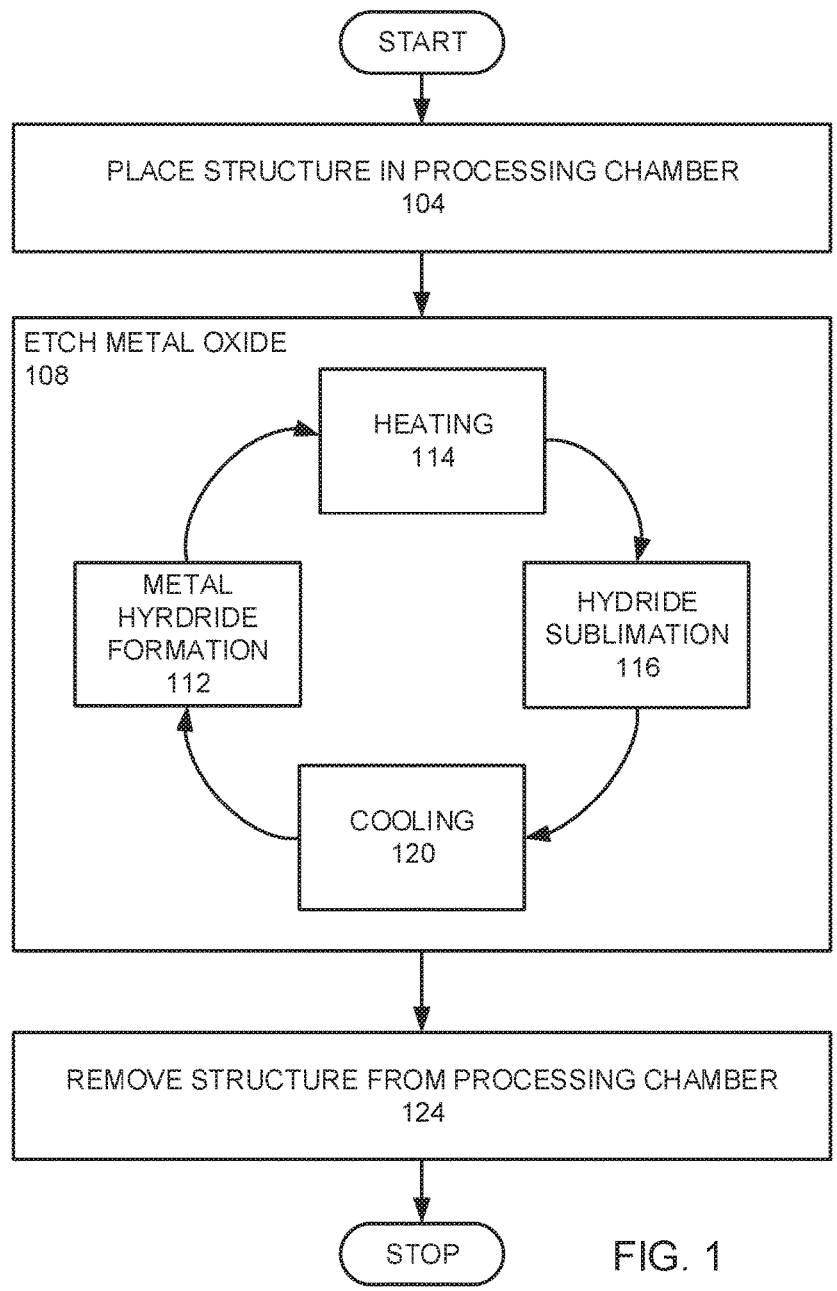
FIG. 1 is a high level flow chart of an embodiment.

FIG. 1 is a high level flow chart of an embodiment. In this embodiment, a substrate with a structure, such as a stack with a metal oxide layer, is placed in a processing chamber (step 104). A selective etch of the metal oxide layer using a cyclical atomic layer etching is provided (step 108). Each cycle of the atomic layer etching process comprises a metal hydride formation phase (step 112), a heating phase (step 114), a hydride sublimation phase (step 116), and a cooling phase (step 120). The substrate with the structure is removed from the processing chamber (step 124).

Example

Figure 2A:
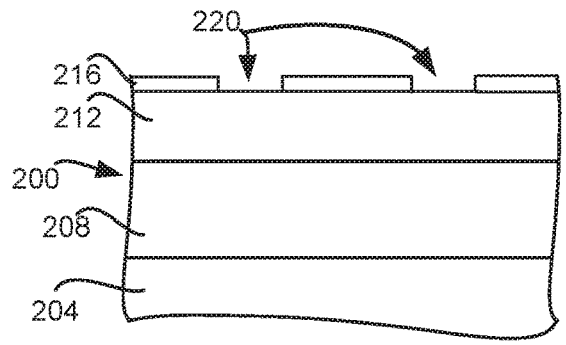
FIGS. 2A-D are schematic cross-sectional views of a structure processed according to an embodiment.

In an example, a substrate with a structure is placed in a processing chamber (step 104). FIG. 2A is a schematic cross-sectional view of a structure 200, such as a stack, with a semiconductor substrate 204, under an intermediate layer 208, under a metal oxide layer 212. In this example, the metal oxide layer is aluminum oxide. A patterned mask 216 with patterned openings 220 was formed over the metal oxide layer 212. The structure 200 is placed in a processing chamber.

Figure 3:
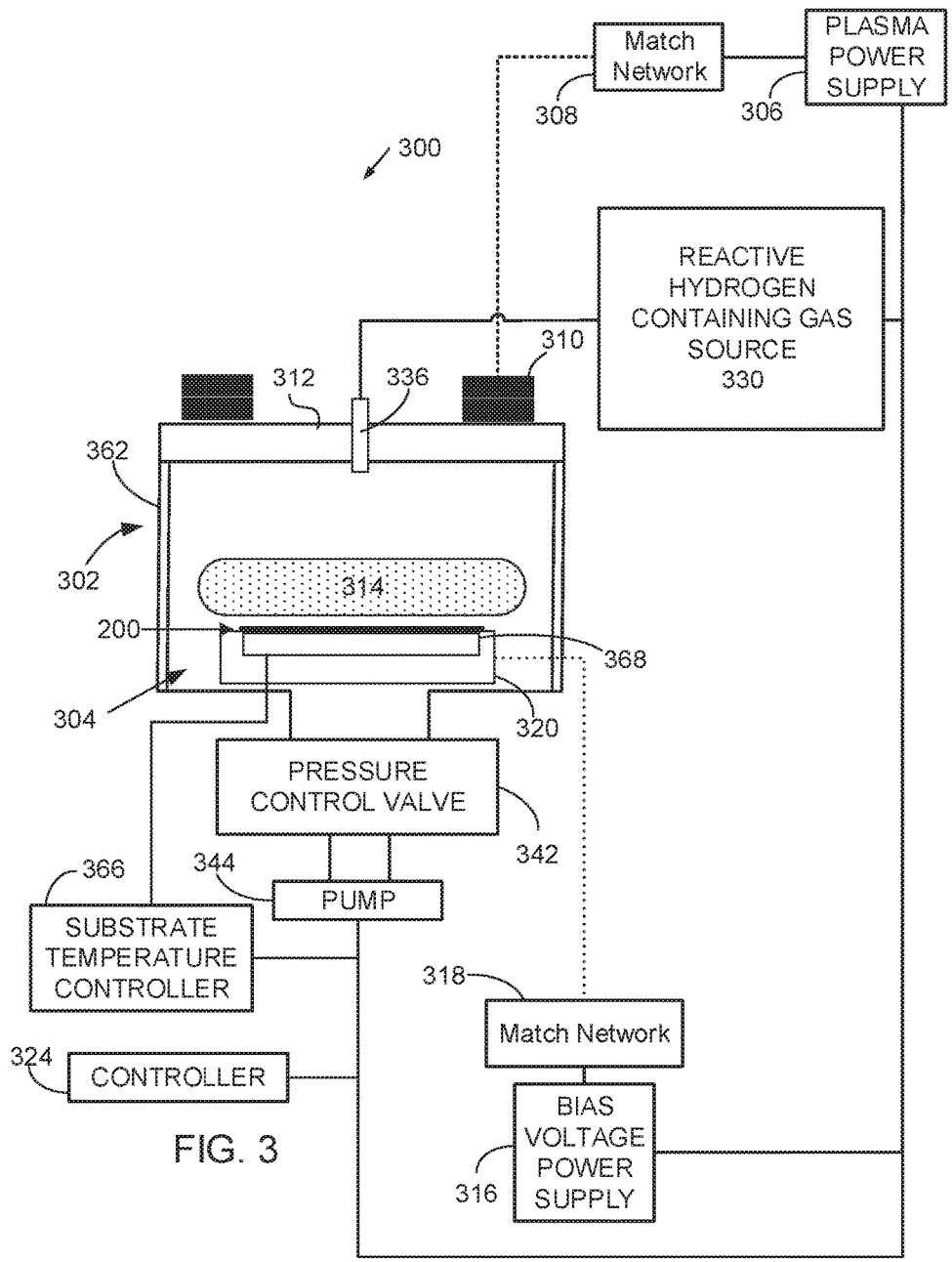
FIG. 3 is a schematic view of a plasma processing chamber that may be used in an embodiment.

FIG. 3 schematically illustrates an example of a plasma processing system 300 which may be used to process the structure 200 in accordance with one embodiment. The plasma processing system 300 includes a plasma reactor 302 having a plasma processing chamber 304, enclosed by a chamber wall 362. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304 while allowing energy to pass from the TCP coil 310 to the plasma processing chamber 304. A wafer bias voltage power supply 316 tuned by a match network 318 provides power to an electrode 320 to set the bias voltage on the substrate 204, which is supported over the electrode 320. A substrate temperature controller 366 is controllably connected to a Peltier heater/cooler 368. A controller 324 sets points for the plasma power supply 306, the substrate temperature controller 366, and the wafer bias voltage power supply 316.

The plasma power supply 306 and the wafer bias voltage power supply 316 may be configured to operate at specific radio frequencies such as, 13.56 MHz, 27 MHz, 2 MHz, 400 kHz, or combinations thereof. Plasma power supply 306 and wafer bias voltage power supply 316 may be appropriately sized to supply a range of powers in order to achieve desired process performance. For example, in one embodiment, the plasma power supply 306 may supply the power in a range of 50 to 5000 Watts, and the wafer bias voltage power supply 316 may supply a bias voltage in a range of 20 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a reactive hydrogen-containing gas source 330. The reactive hydrogen-containing gas source 330 provides gas or remote plasma to a feed 336 in the form of a nozzle. The process gases and byproducts are removed from the plasma processing chamber 304 via a pressure control valve 342 and a pump 344, which also serve to maintain a particular pressure within the plasma processing chamber 304. The reactive hydrogen-containing gas source 330 is controlled by the controller 324. A Kiyo by Lam Research Corp. of Fremont, Calif., may be used to practice an embodiment.

Figure 4:
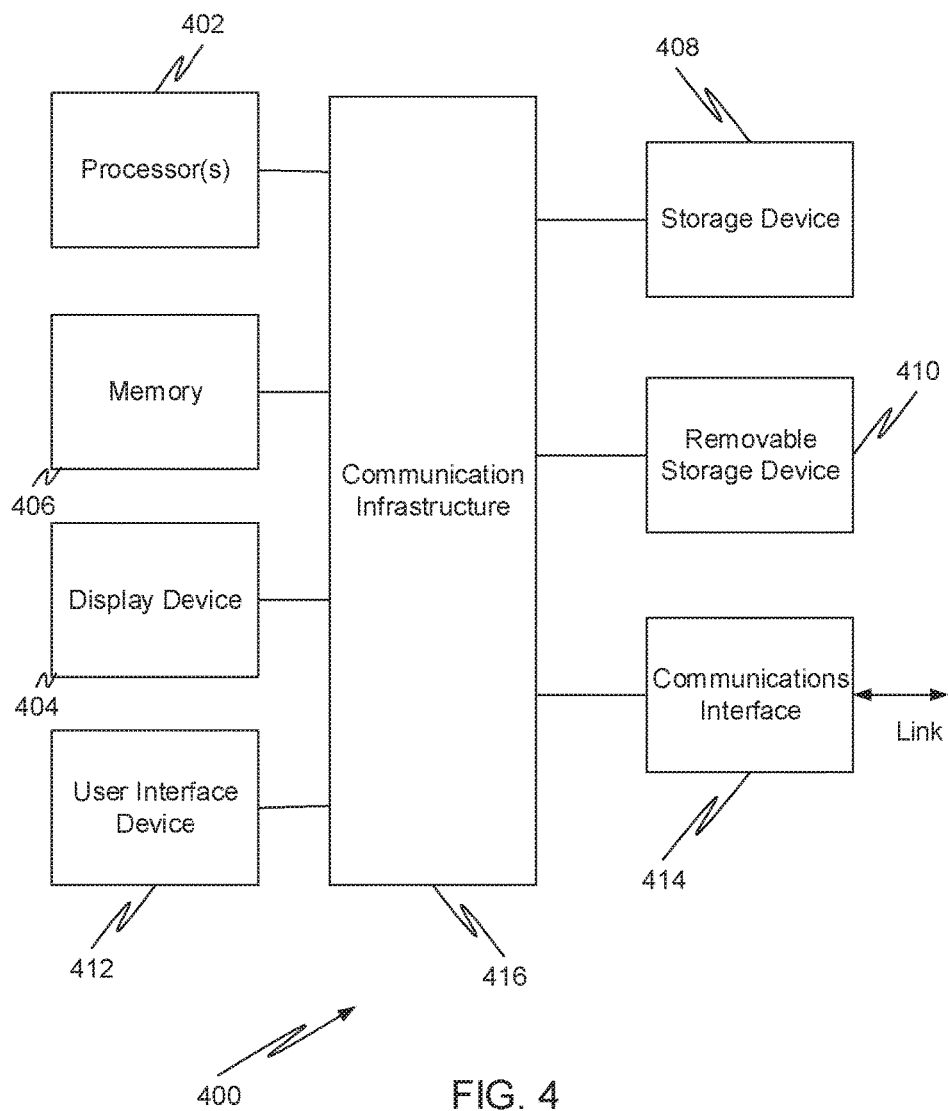
FIG. 4 is a schematic view of a computer system that may be used in practicing an embodiment.

FIG. 4 is a high level block diagram showing a computer system 400, which is suitable for implementing a controller 324 used in embodiments. The computer system may have many physical forms ranging from an integrated circuit, a printed circuit board, and a small handheld device, up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network, such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
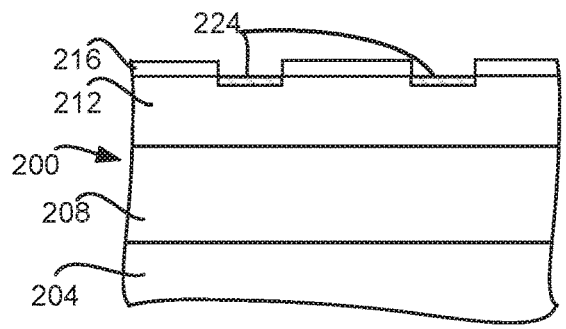

After the structure 200 with the semiconductor substrate 204 has been placed into the plasma processing chamber 304, a cyclical atomic layer etching is provided (step 108). Each cycle of the atomic layer etching process in this embodiment comprises a metal hydride formation phase (step 112), a heating phase (step 114), a hydride sublimation phase (step 116), and a cooling phase (step 120). In the metal hydride formation phase (step 112), the metal oxide layer is exposed to a reactive hydrogen-containing gas or plasma which transforms a layer of the metal oxide into metal hydride. The reactive hydrogen-containing gas in this example is hydrogen that is formed into a plasma by RF power provided by the plasma power supply 306. An example recipe provides a process gas of 200 sccm hydrogen. RF power is provided at a power of between 100 W to 1000 W. Preferably, the RF power is provided at about 250 W. The semiconductor substrate is maintained at a temperature below 100° C. for hydride formation. Once a sufficient layer of metal hydride is formed, the flow of the reactive hydrogen-containing gas or plasma is stopped. FIG. 2B is a schematic cross-sectional view of a structure 200 after the hydride formation phase is completed. A thin metal hydride layer 224 is formed in the open areas, as shown.

The metal hydride is heated to a temperature above the metal hydride's sublimation temperature (step 114). In this example, the aluminum hydride layer is heated to a temperature between 150° C. and 200° C. In this example, the Peltier heater/cooler 368 in FIG. 3 is used as an etch layer heater to heat the structure 200.

Figure 2C:
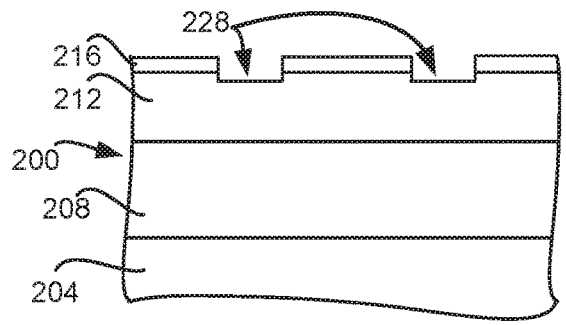

The aluminum hydride sublimes (step 116). FIG. 2C is a schematic cross-sectional view of a structure 200 after the sublimation phase is completed. The metal hydride layers have been sublimed leaving etched features 228.

The cooling phase (step 120) cools the metal oxide layer to a temperature below the sublimation temperature. In this example, the metal oxide layer is cooled to a temperature below 100° C.

Figure 2D:
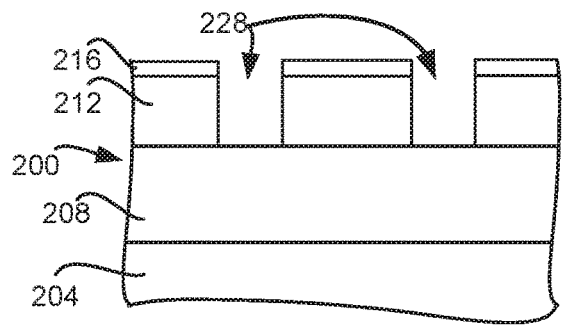

The cyclical process is repeated many times. In this example, the process is repeated from 10 to 1000 times. FIG. 2D is a schematic cross-sectional view of a structure 200 after the atomic layer etch has been performed for a multitude of cycles. The atomic layer etch selectively etched the metal oxide layer 212 with respect to the patterned mask 216 to form completed etched features 228.

By providing a cooling step, which cools the metal oxide to a temperature below the sublimation temperature before forming a metal hydride, the metal hydride formation is self limiting, which is required for an atomic layer etch. A self limiting atomic layer etch provides increased etch control. Preferably, the self limiting aspect of this atomic layer etch causes less than 0.1 nm of the thickness of the etch layer to be etched for each cycle.

Since sublimation is used to remove the metal hydride, chemical etching is not required. Therefore, chemical etchants, such as halogen and oxygen are not needed. For these reasons, preferably, the reactive hydrogen-containing gas or plasma is halogen free and oxygen free. More preferably, the metal oxide etch process is halogen free and oxygen free and each cycle of the etch is a halogen free and oxygen free process.

In various embodiments, the heating of the etch layer may be done using a heat lamp assembly, such as an LED lamp assembly or a flash lamp. In some embodiments, the wafer may be raised up on pins during heating and then lowered to the wafer support, where the wafer support is used as an etch layer cooler to cool the etch layer. Fluid, as either liquid or gas, may flow through the substrate support to either heat or cool the etch layer, or may both heat and cool the etch layer. Preferably, the heater is able to heat the metal hydride layer so that the temperature of the etch layer increases by more than 30° C. in less than 18 seconds. More preferably, the heater is able to heat the metal hydride layer so that the temperature of the etch layer increases by more than 30° C. in less than 10 seconds. Most preferably, the heater is able to heat the metal hydride layer so that the temperature of the metal hydride layer increases by more than 30° C. in less than 3 seconds. Preferably, the heater heats the metal hydride layer to a temperature above 100° C. and not greater than 500° C. Preferably, the cooler is able to cool the etch layer so that the temperature of the etch layer decreases by more than 30° C. in less than 18 seconds. More preferably, the cooler is able to cool the etch layer so that the temperature of the etch layer decreases by more than 30° C. in less than 10 seconds. Most preferably, the cooler is able to cool the etch layer so that the temperature of the etch layer decreases by more than 30° C. in less than 3 seconds. Faster temperature changes allow for faster processing times.

In other embodiments, the etch layer may be various metal oxides. Preferably, the etch layer is at least one of aluminum oxide, which may be formed into $AlH_3$ with a melting point of 150° C., titanium oxide, which may be formed into $TiH_2$ with a melting point of 450° C., magnesium oxide, which may be formed into $MgH_2$ with a melting point of 327° C., chromium oxide, or hafnium oxide, which may be formed into $HfH_2$ with a melting point of 400° C.

In other embodiments a hydrazine or ammonia containing gas is provided. In addition, an inert gas, such as nitrogen, helium, or argon may be provided with the hydrogen, hydrazine, or ammonia. In an embodiment, the reactive hydrogen-containing gas source 330 may provide a remote hydrogen-containing plasma. In another embodiment UV light may be used to make the hydrogen reactive. Reactive hydrogen is defined as hydrogen that has enough energy to overcome the activation barrier required to make a metal hydride out of a metal oxide. The thickness of the formation of the metal hydride is self limiting. In this example, part of the aluminum oxide layer becomes aluminum hydride. After a period, the exposure of the metal oxide layer to the reactive hydrogen-containing gas or plasma is stopped. This stoppage is caused by the self-limiting character of the hydride forming process. In other embodiments, the stoppage is based on time.

Figure 5:
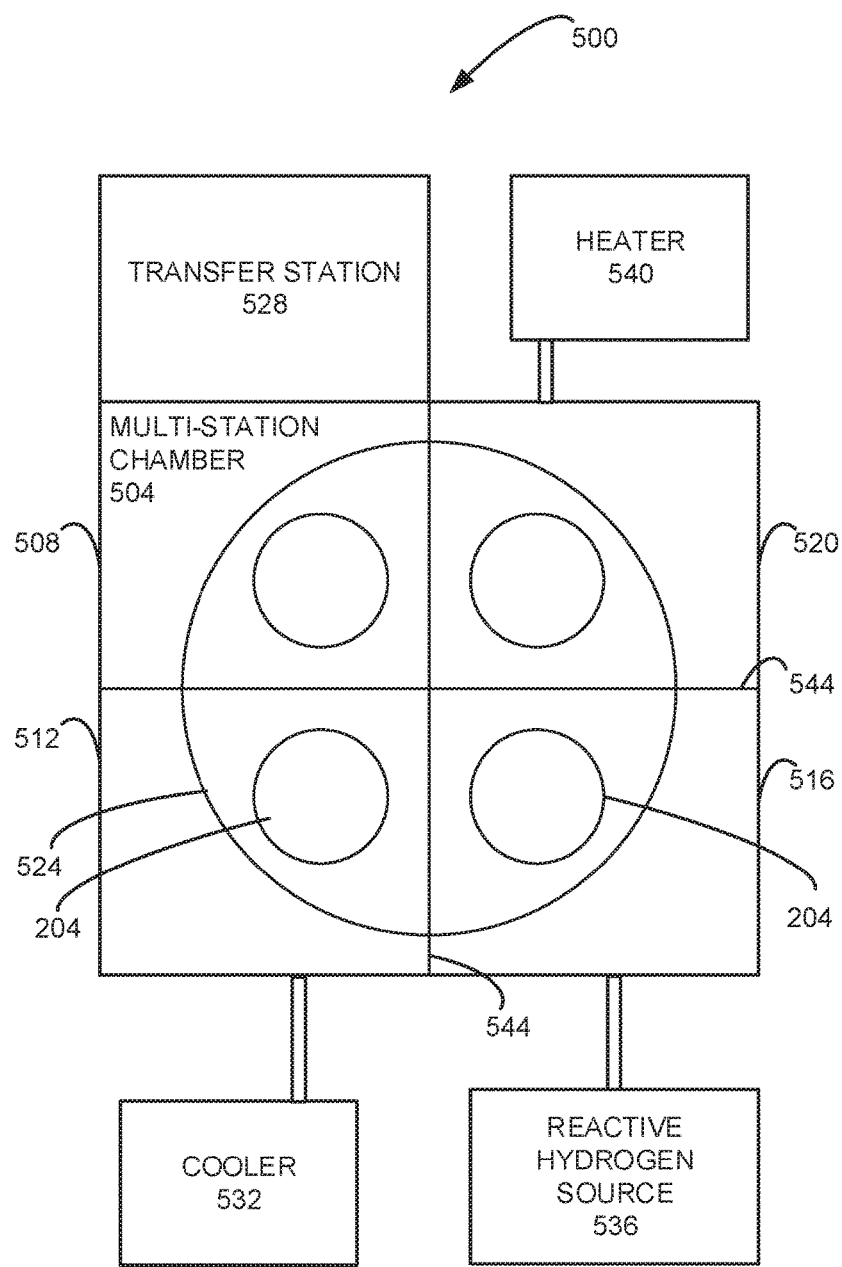
FIG. 5 is a schematic view of another plasma processing chamber that may be used in another embodiment.

FIG. 5 is a schematic top view of a processing system 500 used in another embodiment. The processing system 500 comprises a multi-station chamber 504. The multi-station chamber 504 comprises a first substrate station 508, a second substrate station 512, a third substrate station 516, and a fourth substrate station 520. Interior walls 544 are provided to separate the first substrate station 508, the second substrate station 512, the third substrate station 516, and the fourth substrate station 520. A transporter 524 is able to move a plurality of substrates 204 between the first, second, third, and fourth substrate stations 508, 512, 516, 520. In this embodiment, the first substrate station 508 is connected to a transfer station 528. The transfer station 528 is used to transfer substrates into and out of the multi-station chamber 504. In other embodiments an additional substrate station may be added so that substrates are added in one substrate station and removed from another substrate station. In another embodiment, the substrate station for transferring substrates into and out of the multi-station chamber may also be used for processing the substrate. The transporter 524 moves a substrate 204 from the first substrate station 508 to the second substrate station 512. In this embodiment, while the transporter moves a substrate 204 from the first substrate station 508 to the second substrate station 512, the transporter 524 is also moving another substrate 204 from the second substrate station 512 to the third substrate station 516, and another substrate 204 from the third substrate station 516 to the fourth substrate station 520, and another substrate 204 from the fourth substrate station 520 to the first substrate station 508. The second substrate station 512 is connected to a cooler 532, which is used to cool the substrate 204. The cooler 532 may include a cooled platen over which the transporter 524 moves the substrate 204, where the cooled platen contacts the substrate 204 to cool the substrate 204. In such a case, the cooler 532 would also include a cooling system to cool the platen. A reactive hydrogen-containing gas or plasma source 536 is connected to the third substrate station 516. The reactive hydrogen-containing gas or plasma source 536 may be a remote plasma source, or a hydrogen-containing gas source with an in-situ plasma excitation source for forming the hydrogen-containing gas into a plasma. A heater 540 is connected to the fourth substrate station 520. The heater 540 may be in the form of a heated platen that contacts the substrate 204 when the substrate 204 is moved into the fourth substrate station 520.

The transporter 524 moves the substrate 204 from the first substrate station 508 to the second substrate station 512, which cools the substrate 204, and then to the third substrate station 516, where a hydrogen-containing gas or plasma forms a layer of metal oxide into a layer of metal hydride, and then to a fourth substrate station 520, where the layer of metal hydride is heated and sublimed. The transporter 524 may circulate each substrate 204 around the multi-station chamber 504 a plurality of times to provide a plurality of etch cycles. After a plurality of cycles, the substrate 204 may be removed in the first substrate station 508 and a new substrate 204 may be added in the first substrate station 508. The interior walls 544 reduce the flow of gases between the different substrate stations and also allow for a temperature difference between the different substrate stations.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents that fall within the true spirit and scope of the present disclosure.

What is claimed:
1. A method for etching a metal oxide layer on a semiconductor substrate, comprising providing a plurality of cycles, wherein each cycle comprises:
exposing the metal oxide layer to a reactive hydrogen-containing gas or plasma to transform at least a part of the metal oxide layer into a layer of metal hydride;
stopping the exposing the metal oxide layer to the reactive hydrogen-containing gas or plasma;
heating the layer of metal hydride to at least a sublimation temperature to sublime the layer of metal hydride; and
cooling the metal oxide layer to a temperature below the sublimation temperature.

2. The method, as recited in claim 1, wherein the reactive hydrogen-containing gas or plasma is halogen free and oxygen free.

3. The method, as recited in claim 1, wherein each cycle of the plurality of cycles is a halogen free process.

4. The method, as recited in claim 1, wherein a metal oxide of the metal oxide layer is at least one of aluminum oxide, titanium oxide, magnesium oxide, and hafnium oxide.

5. The method, as recited in claim 1, wherein the heating the layer of metal hydride heats the layer of metal hydride to a temperature above 100° C. and wherein the cooling the metal oxide layer cools the metal oxide layer to a temperature below 80° C.

6. The method, as recited in claim 5, wherein the heating the layer of metal hydride heats the layer of metal hydride to a temperature no greater than 500° C.

7. The method, as recited in claim 1, wherein a thickness of the layer of metal hydride is less than 0.1 nm.

8. The method, as recited in claim 1, wherein the heating the layer of metal hydride and cooling the metal oxide layer are performed in a same reaction chamber.

9. The method, as recited in claim 1, wherein the heating the layer of metal hydride is performed in a first substrate station and cooling the metal oxide layer is performed in a second substrate station.

10. The method, as recited in claim 1, wherein the etching the metal oxide layer is performed without a chemical removal step and wherein the subliming the layer of metal hydride is performed without a chemical removal step.

* * * * *